United States Patent
Cheng et al.

(10) Patent No.: US 8,630,132 B2
(45) Date of Patent: Jan. 14, 2014

(54) SRAM READ AND WRITE ASSIST APPARATUS

(75) Inventors: Chiting Cheng, Taichung (TW); Chung-Cheng Chou, Hsin-Chu (TW); Jonathan Tsung-Yung Chang, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 416 days.

(21) Appl. No.: 13/149,611

(22) Filed: May 31, 2011

(65) Prior Publication Data

US 2012/0307574 A1 Dec. 6, 2012

(51) Int. Cl.
G11C 7/22 (2006.01)

(52) U.S. Cl.
USPC .................. 365/189.14; 365/189.07

(58) Field of Classification Search
USPC .......................... 365/189.14, 189.07
See application file for complete search history.

(56) References Cited

U.S. PATENT DOCUMENTS

| | | | |
|---|---|---|---|
| 7,324,375 B2 * | 1/2008 | Miwa et al. | 365/185.03 |
| 2004/0125677 A1 * | 7/2004 | Khellah et al. | 365/203 |
| 2005/0207246 A1 * | 9/2005 | Sugahara | 365/202 |
| 2013/0163312 A1 * | 6/2013 | Chang | 365/156 |

OTHER PUBLICATIONS

Kellah, M.M., et al., "Read and Write Circuit Assist Techniques for Improving Vccmin of Dense 6T SRAM Cell,"2008 IEEE, 4 Pages.
Nho, H., et al., "A 32nm High-k Metal Gate SRAM with Adaptive Dynamic Stability Enhancement for Low-Voltage Operation," 2010 IEEE, ISSCC, pp. 346-348.
Raychowdhury, A., et al., "PVT-and-Aging Adaptive Wordline Boosting for 8T SRAM Power Reduction," 2010 IEEE, ISSCC, pp. 352-354.
Pilo, H., et al., "A 64Mb SRAM in 32nm High-k Metal-Gate SOI Technology with 0.7V Operation Enabled by Stability, Write-Ability and Read-Ability Enhancements," 2011 IEEE, ISSCC, pp. 254-256.
Takeda, K., et al., "Multi-Step Word-Line Control Technology in Hierarchical Cell Architecture for Scaled-Down High-Density SRAMs," IEEE, Journal of Solid-State Circuits, vol. 46, No. 4, Apr. 2011, pp. 806-814.

\* cited by examiner

Primary Examiner — Tuan T. Nguyen
(74) Attorney, Agent, or Firm — Slater & Matsil, L.L.P.

(57) ABSTRACT

A SRAM READ and WRITE assist apparatus comprises a bit line voltage tracking block, a READ assist timer, a READ assist unit, a WRITE assist unit a WRITE control unit. The bit line voltage tracking block detects a voltage on a tracking bit line coupled to a plurality of tracking memory cells. In response to the voltage drop on the tracking bit line, the READ assist timer generates a READ assist pulse. When the READ assist pulse has a logic high state, an activated word line is pulled down to a lower voltage. Such a lower voltage helps to improve the robustness of SRAM memory circuits so as to avoid READ and WRITE failures.

20 Claims, 4 Drawing Sheets

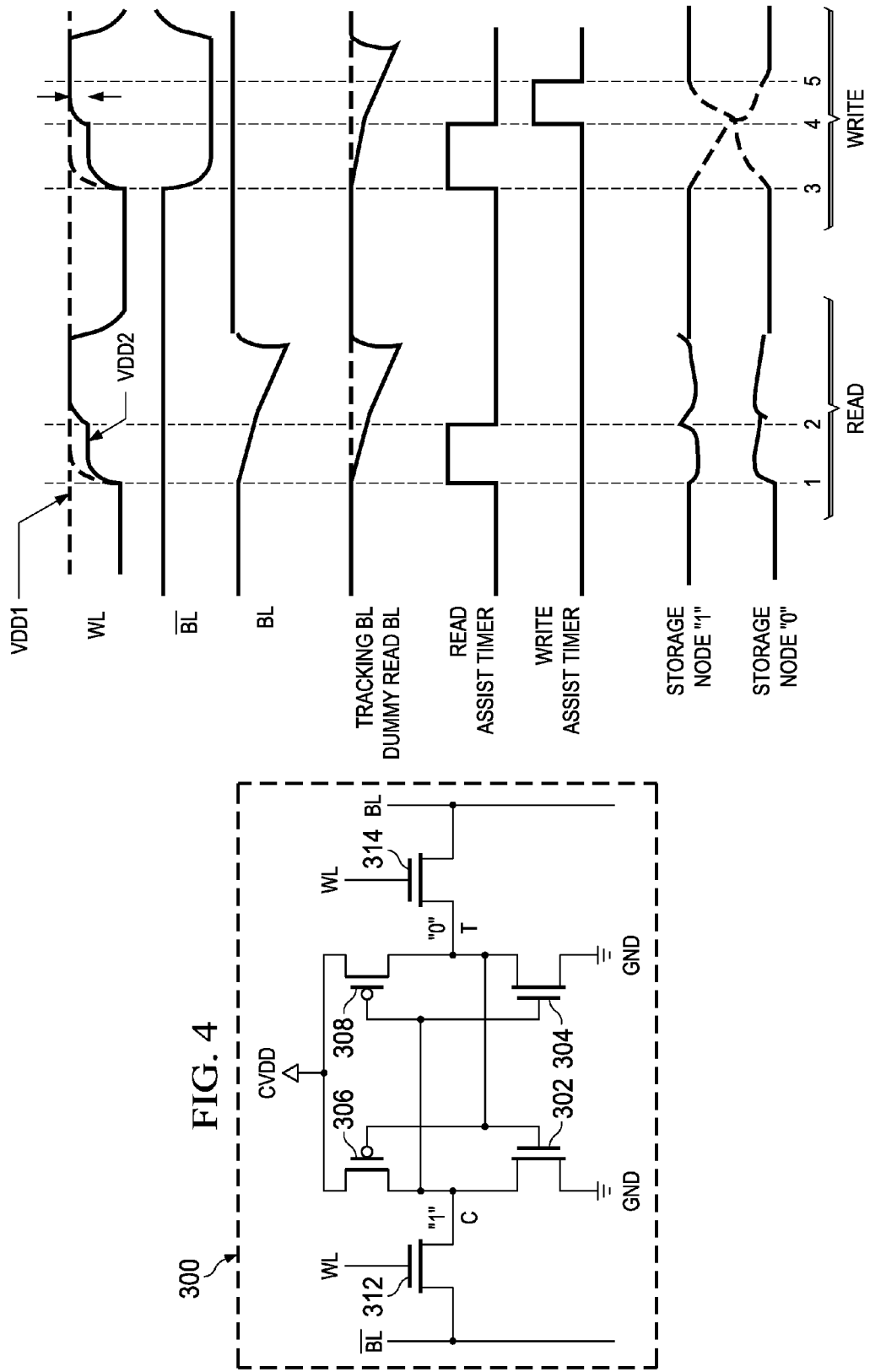

SRAM READ AND WRITE ASSIST APPARATUS

BACKGROUND

Modern electronic devices such as a notebook computer comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them. Non-volatile memories include a variety of sub-categories, such as electrically erasable programmable read-only memory (EEPROM) and flash memory.

SRAM cells may comprise different numbers of transistors. According to the total number of transistors in an SRAM cell, the SRAM cell may be referred to as a six-transistor (6-T) SRAM, an eight-transistor (8-T) SRAM, and the like. SRAM cells are arranged in rows and columns. An SRAM cell is selected during either a READ operation or a WRITE operation by selecting its row and column. The row and column to be selected are determined by a binary code. For example, a 64 Kb memory chip may comprise a 16-bit binary code controlling the WRITE and READ operation. More particularly, the 16-bit binary code is split into two separate 8-bit binary codes for selecting a row and a column respectively. The 64 Kb memory chip may further comprise a row decoder and a column decoder. In response to an 8-bit code, the row decoder is able to generate $2^8$ outputs, which comes to 256 outputs. Likewise, the column decoder is able to generate another $2^8$ outputs. By enabling an output from the row decoder and an output from the column decoder, an SRAM cell can be selected from a memory cell matrix having 256 rows and 256 columns.

Each column of an SRAM cells is connected to both a bit-line (BL) and the inverse of BL ($\overline{BL}$). A data latch of each SRAM cell is used to store a single bit. Both BL and $\overline{BL}$ are used to control the operation of reading a bit from or writing a bit into the SRAM cell. For example, in an SRAM WRITE operation, a logic state "1" stored in a data latch of the SRAM cell can be reset by setting BL to "0" and $\overline{BL}$ to "1". Furthermore, two pass-gate transistors connected between the data latch and BL and $\overline{BL}$ are controlled by a word line. In response to a binary code from the row decoder, a word line coupled to the SRAM cell to be written is asserted so that the data latch is selected to proceed to a WRITE operation. During a WRITE operation, one storage node of the data latch is discharged by BL to "0" and the other storage node of the data latch is charged by $\overline{BL}$ to "1". As a result, the new data logic "0" is latched into the SRAM cell.

In a READ operation, both BL and $\overline{BL}$ of an SRAM cell are pre-charged to a voltage approximately equal to the operating voltage of the memory bank in which the SRAM cell is located. In response to a binary code from the row decoder, a word line coupled to the SRAM cell to be read is asserted so that the data latch is selected to proceed to a READ operation. During a READ operation, through a turned on pass-gate transistor, one bit line coupled to the storage node storing a logic "0" is discharged to a lower voltage. Meanwhile, the other bit line remains the pre-charged voltage because there is no discharging path between the other bit line and the storage node storing a logic "1". The differential voltage between BL and $\overline{BL}$ (approximately in a range from 50 to 100 mV) is detected by a sense amplifier. Furthermore, the sense amplifier amplifies the differential voltage and reports the logic state of the memory cell via a data buffer.

As semiconductor technologies evolve, the operating voltages of SRAM memory chips are further reduced. The decrease of the operating voltages can reduce SRAM cell power consumption. However, the lower operating voltages of SRAM cells may reduce WRITE and READ margins to a low level. Such a low level can cause less reliable WRITE and READ operations.

BRIEF DESCRIPTION OF THE DRAWINGS

For a more complete understanding of the present invention, and the advantages thereof, reference is now made to the following descriptions taken in conjunction with the accompanying drawings, in which:

FIG. 4 illustrates a timing diagram that shows a READ cycle and a WRITE cycle of an SRAM cell with a low power SRAM WRITE operation.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a static random access memory (SRAM) READ and WRITE assist apparatus. The invention may also be applied, however, to a variety of memory circuits.

Figure 1:
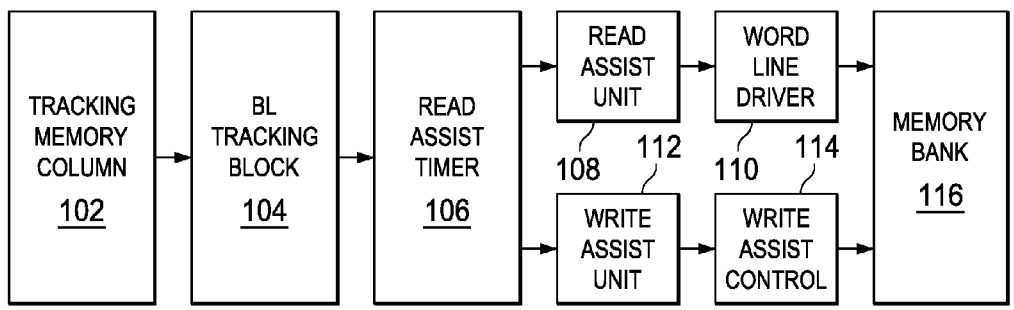
FIG. 1 illustrates a block diagram of an SRAM READ and WRITE assist apparatus in accordance with an embodiment.

Referring initially to FIG. 1, a block diagram of an SRAM READ and WRITE assist apparatus is illustrated in accordance with an embodiment. The SRAM READ and WRITE assist apparatus comprises a tracking memory cell column 102, a bit line tracking block 104, a READ assist timer 106, a READ assist unit 108, a word line driver 110, a WRITE assist unit 112, a WRITE assist control unit 114 and a memory bank 116. In accordance with an embodiment, the tracking memory column 102 may comprise a plurality of memory cells arranged in a column. Furthermore the plurality of memory cells are vertically coupled to a tracking bit line. Each memory cell of the tracking memory column 102 may have the same structure and performance parameters as that of the memory bank 116. By employing the tracking memory column 102, the bit line tracking block 104 can estimate the bit line voltage drop of the memory bank 116 by measuring the voltage of the tracking bit line of the track memory column 102. The detailed description of the operation of the tracking memory column 102 will be described below with respect to FIG. 2.

The bit line tracking block 104 has an input coupled to the tracking memory column 102. The bit line tracking block 104 acts as a voltage detector sensing the voltage drop on the tracking bit line of the tracking memory column 102. The bit line tracking block 104 further sends the voltage drop information to the READ assist timer 106 in which a READ assist pulse is generated. Such a READ assist pulse is used to control the READ assist unit 108 and the WRITE assist unit 112. In response to the READ assist pulse, the READ assist unit 108 may adjust an asserted word line voltage of the memory bank 116 via the word line driver 110 during a period of time controlled by the READ assist pulse. Likewise, the WRITE assist unit 112 may adjust an operation voltage of the memory bank 116 via the WRITE control unit 114 during a period of time of the WRITE cycle. In sum, based upon the information obtained from the tracking memory column 102, the operation conditions of the memory bank 116 can be estimated so that various READ and WRITE assist schemes such as reducing an asserted word line voltage to a lower level, can be applied to the memory bank 116.

Figure 2:
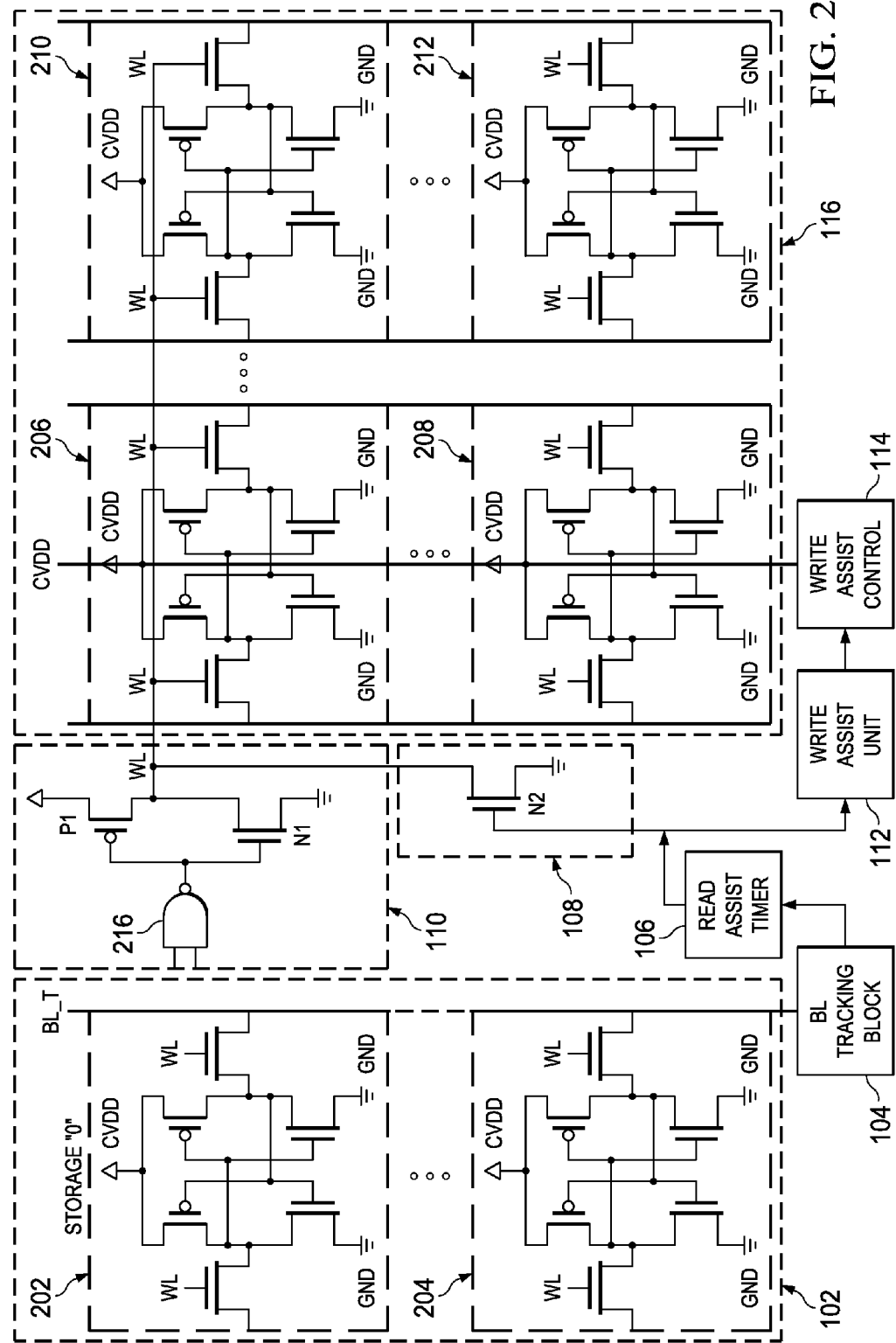
FIG. 2 illustrates in detail a schematic diagram of the SRAM READ and WRITE assist apparatus shown in FIG. 1.

FIG. 2 illustrates in detail a schematic diagram of the SRAM READ and WRITE assist apparatus shown in FIG. 1. In accordance with an embodiment, the memory bank 116 may comprise a plurality of memory cells (e.g., memory cell 206) arranged in rows and columns. As known in the art, each memory cell may comprise two pass-gate transistors whose gates are coupled to a word line. Furthermore, in a READ or WRITE operation, the memory cells arranged in one row are controlled by a same word line. More particularly, according to the decoded address of a READ or WRITE control signal, a word line is set to a logic high state when the row of memory cells coupled to the word line will be accessed. The logic high state at the word line turns on each memory cell's pass-gate transistors of the memory row to which the word line is coupled. As a result, a READ or WRITE operation can be performed through the turned on pass-gate transistors.

The memory cells in a column of the memory bank 116 may be vertically connected to a first bit line (BL) and a second bit line ($\overline{BL}$) wherein the second bit line $\overline{BL}$ is the inverse of the first bit line BL. The bit line voltage (e.g., the voltage at BL) determines the READ and WRITE margins of an SRAM cell. The relationship between the bit line voltage and the READ and WRITE margins will be described in detail with respect to FIG. 5. A tracking memory column 102 is used to estimate the bit line voltage change of the memory bank 116. The tracking memory column 102 may comprise a plurality of memory cells vertically connected to a tracking bit line (BL_T). There may be a logic "0" state stored at the storage nodes coupled to the tracking bit line BL_T. During a READ or WRITE operation of the memory bank 116, a tracking READ operation occurs at the tracking memory column 102. The tracking READ operation may be applied to a memory cell of the tracking memory column 102. Alternatively, in order to compensate operation and process variations, the tracking READ operation may be applied to a plurality of memory cells of the tracking memory column 102. Furthermore, the average voltage drop of the tracking bit line BL_T is used to be a better estimate of the voltage drop of the bit line of the memory bank 116.

The bit line tracking block 104 is used to detect the voltage drop on the tracking bit line BL_T. The bit line tracking block 104 may be implemented by a comparator in which the detected tracking bit line voltage is compared with a predetermined reference voltage. As soon as the detected tracking bit line voltage reaches the predetermined reference voltage, the bit line tracking block 104 sends a control signal to the READ assist timer 106. In response to the control signal, the READ assist timer 106 terminates a READ assist pulse. The detailed waveforms of the tracking bit line voltage and the READ assist pulse will be described below with respect to FIG. 3. It should be noted that the methods of tracking a voltage and generating a pulse are well known, and hence are presented without detailed description in order not to obscure the present invention in unnecessary detail. For the most part, details unnecessary to obtain a complete understanding of the present invention have been omitted inasmuch as such details are within the skills of persons of ordinary skill in the relevant art.

During a READ cycle, the READ assist pulse from the READ assist timer 106 is coupled to the READ assist unit 108. In accordance with an embodiment, the READ assist unit 108 may comprise an n-type metal oxide semiconductor (NMOS) transistor N2 having a drain coupled to a word line of the memory bank 116, a source coupled to ground and a gate controlled by the READ assist pulse. When the READ assist pulse has a logic high state, the NMOS transistor N2 is turned on. As a result, the word line WL is pulled down. The detailed operation of this READ assist scheme will be illustrated below with respect to FIG. 3. The word line driver 110 acts as an address decoder through which a correct word line is activated based upon an address received by the word line driver 110. The operation of the word line driver 110 is known in the art, and hence is not discussed in detail in order to avoid repetition.

The WRITE assist unit 112 receives the READ assist pulse from the READ assist timer 106. In response to the READ assist pulse, the WRITE assist unit 112 may generate two different types of WRITE assist pulses depending on the type of applications. More particularly, when the WRITE operation is a high speed WRITE operation, the WRITE assist unit 112 may generate a wide WRITE assist pulse. On the other hand, when the WRITE operation is a low power WRITE operation, the WRITE assist unit 112 may generate a narrow WRITE assist pulse. The detailed operation of the WRITE assist unit 112 will be illustrated with respect to FIG. 3.

In response to the WRITE assist pulse from the WRITE assist unit 112, the WRITE assist control unit 114 may lower down the operation voltage of the memory cell in a WRITE mode. More particularly, the voltage bus CVDD is configured such that when the WRITE assist pulse has a logic high state, the voltage bus CVDD is coupled to a WRITE assist voltage potential (not shown), which is lower than the normal operating voltage of the memory bank 116. In contrast, when the SRAM cell is not in a WRITE operation mode or the WRITE assist pulse has a logic low state, the writing assist timing control unit 110 turns off the connection between the voltage bus CVDD and the WRITE assist voltage potential and connects the voltage bus CVDD to the normal voltage potential VDD (not shown). By connecting the voltage bus CVDD to a lower voltage potential during a WRITE operation, the WRITE operation can be faster and easier.

Figure 3:
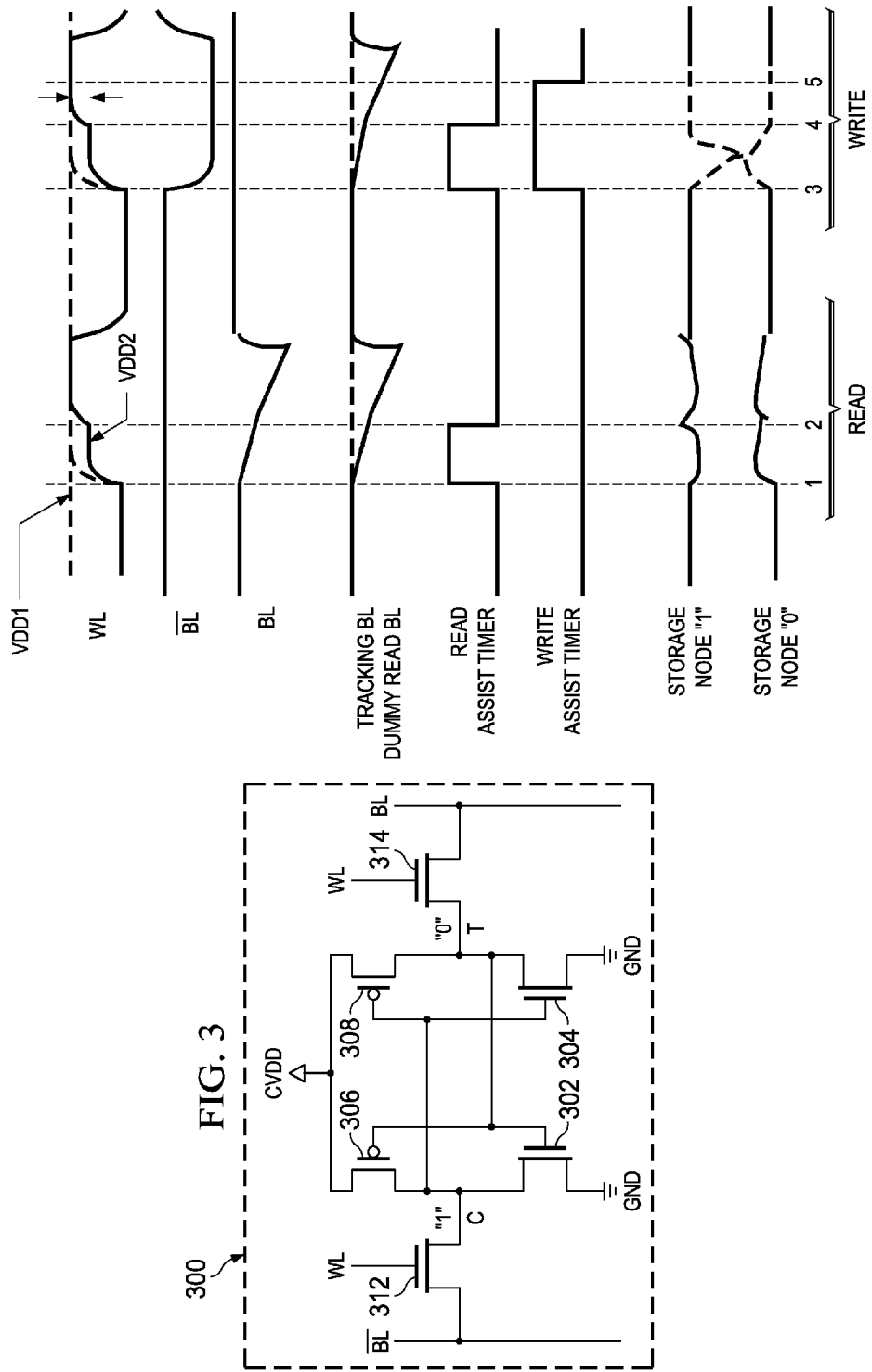
FIG. 3 illustrates a timing diagram that shows a READ cycle and a WRITE cycle of an SRAM cell with a high speed SRAM WRITE operation.

FIG. 3 illustrates the schematic diagram of an SRAM cell in accordance with an embodiment. The SRAM cell 300 comprises a first inverter formed by a pull-up p-type metal oxide semiconductor (PMOS) transistor 306 and a pull-down NMOS transistor 302 and a second inverter formed by a pull-up PMOS transistor 308 and a pull-down NMOS transistor 304. Both the first inverter and second inverter are coupled between a voltage bus CVDD and ground. Furthermore, the first inverter and the second inverter are cross-coupled. That is, the first inverter has an input connected to the output of the second inverter. Likewise, the second inverter has an input connected to the output of the first inverter. The output of the first inverter is referred to as a storage node C and the output of the second inverter is referred to as a storage node T. In a normal operating mode, the storage node C is in the opposite logic state as the storage node T. By employing the two cross-coupled inverters, the SRAM cell 300 can hold the data using a latched structure so that the stored data will not be lost without applying a refresh cycle.

The SRAM cell 300 comprises a first pass-gate transistor 112 connected between $\overline{BL}$ and the output of the first inverter. The SRAM cell 100 further comprises a second pass-gate transistor 114 connected between BL and the output of the second inverter. The gates of the first gate-pass transistor 112 and the second gate-pass transistor 114 are connected to a word line (WL). During a WRITE operation, $\overline{BL}$ and BL are set to opposite logic values according to the new data that will be written into the SRAM cell 300. When the SRAM cell 300 is selected, a logic high state is applied to WL accordingly. As a result, the storage nodes C and T are connected to $\overline{BL}$ and BL respectively. As a consequence, the logic values at $\overline{BL}$ and BL are written into the storage nodes C and T.

FIG. 3 further illustrates a timing diagram that shows a READ cycle and a WRITE cycle of the SRAM cell 300. In the present example, assume that the WRITE cycle is based upon a high speed SRAM operation. At the first time instance (labeled by dashed line 1), when the leading edge of a READ clock signal (not shown) arrives, the word line WL is selected by the word line driver and rises from a low voltage to a high voltage (e.g., VDD1). At the same time, the READ assist timer starts a READ assist pulse. In response to the logic high state of the READ assist pulse, the NMOS transistor N2 (not shown but illustrated in FIG. 2) is turned on. As a result, the voltage at the word line WL drops from VDD1 to VDD2 because the turned-on NMOS transistor N2 pulls down the bus to which the NMOS transistor N2 is coupled to a lower voltage level. Despite being pulled down to a relatively lower voltage, the voltage of the word line WL is able to turn on the pass-gate transistors 112 and 114. The bit line BL starts to drop because the logic low stored at the storage node T discharges the bit line BL via the turned-on pass-gate transistor 114. In accordance with an embodiment, the bit line tracking memory cell (e.g. memory cell 202 shown in FIG. 2) may perform a READ "0" operation in response to the lead edge of the READ clock. As shown in FIG. 3, the voltage curve on the tracking bit line is similar to that of the bit line of the memory cell 300 because, as described above, the structure and parameters of the tracking memory cell are the same as that of the memory cells in the memory bank 116. As shown in FIG. 3, the voltage of the word line WL stays at VDD2 until the second time instance (labeled by dashed line 2).

At the second time instance, as soon as the bit line tracking block 104 detects the tracking bit line voltage reaches a predetermined threshold, the bit line tracking block 104 sends a control signal to the READ assist timer 106. In response to the control signal, the READ assist pulse is terminated at the second time instance. As a result, the NMOS transistor N2 is turned off. Consequently, the word line WL rises from VDD2 to VDD1. One advantageous feature of having an adjustable word line WL voltage is that the lower operating voltage of the word line WL can avoid READ disturbance. As shown in FIG. 3, the READ disturbance on the first and the second storage nodes is reducing by employing the READ assist scheme described above.

At the third time instance (labeled by dashed line 3), the SRAM cell 300 may enter a WRITE cycle. When the leading edge of a WRITE clock signal (not shown) arrives, the word line WL is selected by the word line driver and rises from a low voltage to a high voltage (e.g., VDD1). At the same time, the READ assist timer starts a READ assist pulse. In response to the logic high state of the READ assist pulse, the WRITE assist unit 112 generates a WRITE assist pulse. In addition, the NMOS transistor N2 (not shown but illustrated in FIG. 2) is turned on. As a result, the voltage at the word line WL drops from VDD1 to VDD2 because the turned-on NMOS transistor N2 pulls down the bus to which the NMOS transistor N2 is coupled to a lower voltage level. Despite being pulled down to a relatively lower voltage, the voltage of the word line WL is able to turn on the pass gates 112 and 114. In order to reset the logic state of the memory cell 300, the bit line $\overline{BL}$ is set to a logic low state. In accordance with an embodiment, the bit line tracking memory cell (e.g. memory cell 202 shown in FIG. 2) may perform a READ "0" operation in response to the lead edge of the WRITE clock. As shown in FIG. 3, the voltage of the word line WL stays at VDD2 until the fourth time instance (labeled by dashed line 4). It should be noted as a high speed operation, the WRITE operation starts earlier than that of a low power operation, which will be described in detail with respect to FIG. 4.

At the fourth time instance, as soon as the bit line tracking block 104 detects the tracking bit line voltage reaches a predetermined threshold, the bit line tracking block 104 sends a control signal to the READ assist timer 106. In a high speed application, the READ assist pulse is terminated at the fourth time instance. As a result, the NMOS transistor N2 is turned off. Consequently, the word line WL rises from VDD2 to VDD1. As shown in FIG. 3, the voltage of the WRITE assist pulse stays at a logic high state until the fifth time instance (labeled by dashed line 5). The width between the fourth time instance and the fifth time instance may be inversely proportional to VDD1.

During the period between the fourth time instance and the fifth time instance, in response to the WRITE assist pulse, the WRITE assist control unit 114 may employ various WRITE assist control schemes. In accordance with an embodiment, the voltage bus CVDD is configured such that during a WRITE operation, the voltage bus CVDD is coupled to a WRITE assist voltage potential through a switch controlled by a WRITE assist timing control unit 110. In contrast, when the SRAM cell 100 is not in a WRITE operation mode or the WRITE assist pulse has a logic low state, the writing assist timing control unit 110 turns off the connection between the voltage bus CVDD and the WRITE assist voltage potential and connects the voltage bus CVDD to a voltage potential VDD. It should be noted that the voltage level of the WRITE assist voltage is less than the voltage level of VDD. By connecting the voltage bus CVDD to a lower voltage potential during a WRITE operation, the WRITE operation can be faster and easier.

FIG. 4 illustrates a timing diagram that shows a READ cycle and a WRITE cycle corresponding to a low power SRAM operation. The READ cycle of FIG. 4 is similar to that of FIG. 3, and hence is not discussed in detail to avoid repetition. At the third time instance, when the leading edge of the WRITE control signal arrives, the WRITE assist timer may not generate a WRITE assist pulse until the fourth time instance. As a result, the WRITE assist pulse under a lower power SRAM operation may be narrower than that of the high speed operation. It should be noted that during a low power operation, the WRITE assist scheme may be applied to the WRITE operation later than that of a high speed application. It should be further noted that the operating voltage of a low power application may be lower than that of a high speed operation. As a result, the WRITE operation may not occur until the word line voltage WL resumes to its normal operation voltage.

Figure 5:
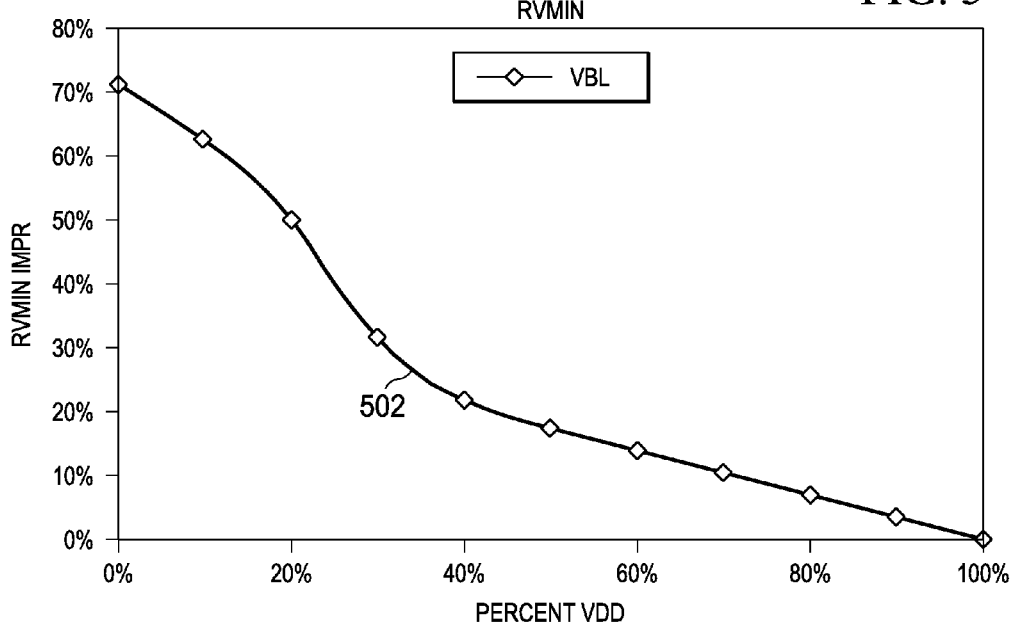
FIG. 5 illustrates the relationship between the bit line voltage and the operating voltage margin of an SRAM cell.

FIG. 5 illustrates the relationship between the bit line voltage and the operating voltage margin (also referred to as static noise margin). The horizontal axis of FIG. 5 represents the bit line voltage of a memory cell. The vertical axis of FIG. 5 represents the operating voltage margin. A curve 502 gives a relationship between the bit line voltage and the operating voltage margin. As shown in FIG. 5, when the bit line voltage is at 100% of its normal voltage, the operating voltage margin is approximately zero volts. In contrast, the operating voltage margin is improved up to 70% of its normal operating voltage when the bit line voltage drops to 0% of its normal voltage. In other words, when the bit line voltage drops to a lower percentage, such as 50%, there may be enough operating voltage margin. As a result, the word line WL can resume to its normal voltage VDD1 when the bit line voltage drops below 50% of its normal voltage.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
a plurality of bit line tracking memory cells, each of which corresponds to a word line of a memory bank, wherein the plurality of bit line tracking memory cells are arranged in a column and coupled to a tracking bit line;
a bit line voltage tracking block coupled to the tracking bit line;
a READ assist timer coupled to the bit line voltage tracking block, wherein the READ assist timer generates a READ assist pulse; and
a READ assist unit configured to pull a voltage of a word line down to a lower level than a normal voltage of the word line when the READ assist pulse has a logic high state.

2. The apparatus of claim 1, wherein a tracking memory cell performs a READ "0" operation when a corresponding word line is activated.

3. The apparatus of claim 1, wherein a plurality of tracking memory cells perform a READ "0" operation when a corresponding word line is activated.

4. The apparatus of claim 1, wherein the READ assist pulse is terminated when a voltage on the tracking bit line is less than a predetermined value.

5. The apparatus of claim 1, wherein the READ assist unit comprises an n-type metal oxide semiconductor (NMOS) transistor comprising:
a drain coupled to a word line of the memory bank;
a source coupled to ground; and
a gate coupled to the READ assist pulse.

6. The apparatus of claim 1, wherein the READ assist unit comprises a p-type metal oxide semiconductor (PMOS) transistor comprising:
a source coupled to a word line of the memory bank;
a drain coupled to ground; and
a gate coupled to the READ assist pulse via an inverter.

7. The apparatus of claim 1, further comprising:
a WRITE assist unit configured to generate a WRITE assist pulse in response to the READ assist pulse, wherein the WRITE assist unit generates a WRITE assist pulse having a width inversely proportional to an operating voltage of the memory bank; and
a WRITE control unit configured to pull an operating voltage of the memory bank down to a lower level than a normal operating voltage of the memory bank when the WRITE assist pulse has a logic high state.

8. The apparatus of claim 1, further comprising a word line driver configured to activate a word line by decoding an address.

9. A system comprising:
a plurality of tracking memory cells arranged in a column;
a memory bank having a plurality of memory cells arranged in a plurality of rows, each of which is coupled to a word line; and
a READ and WRITE assist apparatus comprising:
a bit line voltage tracking block configured to detect a voltage on a tracking bit line coupled to the plurality of tracking memory cells;
a READ assist timer coupled to the bit line voltage tracking block, wherein the READ assist timer generates a READ assist pulse;
a READ assist unit configured to pull a voltage of a word line down to a lower level than a normal voltage of the word line when the READ assist pulse has a logic high state;
a WRITE assist unit configured to generate a WRITE assist pulse in response to the READ assist pulse; and
a WRITE control unit configured to pull an operating voltage of the memory bank down to a lower level than a normal operating voltage of the memory bank when the WRITE assist pulse has a logic high state.

10. The system of claim 9, further comprising a word line driver comprising:
an inverter having an input coupled to an NAND gate and an output coupled to a word line of the memory bank, wherein the word line is selected when the NAND gate receives a decoded address.

11. The system of claim 9, wherein the WRITE assist unit is configured such that:
a WRITE assist pulse starts from a leading edge of a READ assist pulse when the memory bank operates in a high speed mode; and
a WRITE assist pulse starts from a trailing edge of the READ assist pulse when the memory bank operates in a low power mode.

12. The system of claim 11, wherein the WRITE assist pulse is inversely proportional to an operating voltage of the memory bank.

13. The system of claim 9, wherein the tracking memory cells perform a READ "0" operation when a corresponding word line is selected.

14. The system of claim 9, wherein a word line voltage is pulled down to a lower voltage when the READ assist pulse has a logic high state.

15. A method comprising:
performing a READ "0" operation at a plurality of tracking memory cells coupled to a tracking bit line;
detecting a voltage on the tracking bit line;
generating a READ assist pulse; and
terminating the READ assist pulse when the voltage on the tracking bit line drops below a predetermined value.

16. The method of claim 15, further comprising:
pulling down a voltage on an activated word line when the READ assist pulse has a logic high state.

17. The method of claim 15, further comprising:
generating a WRITE assist pulse, wherein the WRITE assist pulse starts at a leading edge of the READ assist pulse when a memory bank operates in a high speed mode; and
reducing an operating voltage of the memory bank to a lower level than a normal operating voltage of the memory bank when the WRITE assist pulse has a logic high state.

18. The method of claim 15, further comprising:
generating a WRITE assist pulse, wherein the WRITE assist pulse starts at a trailing edge of the READ assist pulse when a memory bank operates in a low power mode; and
reducing an operating voltage of the memory bank to a lower level than a normal operating voltage of the memory bank when the WRITE assist pulse has a logic high state.

19. The method of claim 18, further comprising:
generating a width of the WRITE assist pulse, wherein the width of the WRITE assist pulse is inversely proportional to the operating voltage of a memory bank.

20. The method of claim 15, further comprising:
receiving an address;
decoding the address; and
activating a word line by a word line driver based upon a decoded address.

* * * * *